United States Patent [19]

Brotz

[11] Patent Number: 4,628,143

[45] Date of Patent: Dec. 9, 1986

[54] FOAMED NUCLEAR CELL

[76] Inventor: Gregory R. Brotz, 218 Pioneer Rd., Sheboygan, Wis. 53081

[21] Appl. No.: 588,344

[22] Filed: Mar. 12, 1984

[51] Int. Cl.[4] .............................................. H01L 31/04

[52] U.S. Cl. ..................................... 136/253; 310/303

[58] Field of Search ................ 136/253, 254; 310/303, 310/304, 305

[56] References Cited

U.S. PATENT DOCUMENTS 3,497,392 2/1970 Walker ................................ 136/253

3,715,237 2/1973 Walker ................................ 136/253

4,390,743 6/1983 Dahlberg ............................ 136/258

OTHER PUBLICATIONS

A. Thomas, "Nuclear Batteries: Types & Possible Uses" *Nucleonics*, vol. 13, No. 11, pp. 129–133 (1955).

*Primary Examiner*—Aaron Weisstuch

*Attorney, Agent, or Firm*—William Nitkin

[57] ABSTRACT

An electric current generating cell comprising an open-cellular foamed semiconductor and means to excite the semiconductor to produce electric potential.

4 Claims, 6 Drawing Figures

FOAMED NUCLEAR CELL

BACKGROUND OF THE INVENTION

1. Field of the Invention

This invention is in the field of electric current generating nuclear cells and more particularly relates to cells which contain radioactive material therein to ionize a material in the cell to produce radiations which activate photovoltaic portions of the cell to produce electric currents.

2. History of the Prior Art

U.S. Pat. No. 3,497,392 to J. B. Walker shows an electric current generating cell including radioactive material which "cell has a sealed case in which there is a photoelectric core that is sensitive to ultraviolet radiations. This core is provided with a multiplicity of cavities communicating with the outside of it and preferably interconnecting with one another, whereby to provide the core with a very large surface area in relation to its size. The case also contains an ionizable fluid that surrounds the photoelectric core and fills its cavities. This fluid is such that it produces ultraviolet radiation when ionized . . . The fluid is ionized by the radiations of . . . radioactive material . . . The resulting ultraviolet radiations activate the core to produce electric current . . . " To create the "multiplicity of cavities", Walker used a plurality of coated balls packed together with the spaces therebetween as the cavities. Unfortunately, the majority of the space which was taken up by the solid mass of the balls was useless in this cell.

SUMMARY OF THE INVENTION

The Walker patent shows an appreciation that an increase of surface area within such a sealed cell will increase the efficiency of these nuclear batteries and it is an object of this invention to provide such an energy cell with a substantially increased surface area than what was envisioned in the prior art. To accomplish this increase in surface area, the cell of this invention has been developed with an open-cellular foamed core. Such foam, with its myriad of small intertices provides an enormous surface area in relation to the total volume of the cell for a substantially increased area of photovoltaic reaction and the resulting increased efficiency in the production of electric current.

It is a further object of this invention to provide a foam of carbon or other suitable material coated with a semiconductor such as silicon or equivalent. The resulting semiconducting foam structure in one embodiment may be impregnated with a solid radioactive material and phosphor blend. When an appropriate pole is inserted in the foam, a second nonconnected pole would create an electric current with the first when the resulting structure is within a vacuum. Such cells though may include many other basic constructions. For example, an embodiment with the semiconducting foam coated with phosphor may be utilized with a radioactive electrically-conducting gas which can be entered into the cell. In another embodiment the semiconducting foam may be coated and/or impregnated with a radioactive source material and phosphor blend using a conductive gas or a vacuum as mentioned above to produce a conductive path to the second electrode. In yet another embodiment the semiconducting foam can be coated with a radioactive source material and a conductive fluorescing gas can be entered into the cell. Many other embodiments involving various combinations of materials in a foamed semiconductor fall within the scope of this invention.

In yet another embodiment, a radioactive source can be centrally placed within an open area in a carbon foam matrix with no semiconductor layer or luminescing agent being present. When this foam structure is placed in a vacuum chamber with conductive chamber walls making a first terminal with the carbon foam insulated from the chamber wall being a second terminal, electron or alpha emissions from the radioactive source would be collected on the high surface area of the carbon foam and when a circuit was made between the terminals, an electric potential would be produced.

It is still yet a further object of this invention to illustrate a method of fabrication of a foamed substrate such as of carbon or equivalent and method of fusing silicon or equivalent thereto in a way to form a semiconducting layer on the foam substrate.

FIG. *2a* illustrates a cross-sectional view of a further alternate embodiment of a nuclear cell of this invention.

Figure 3:
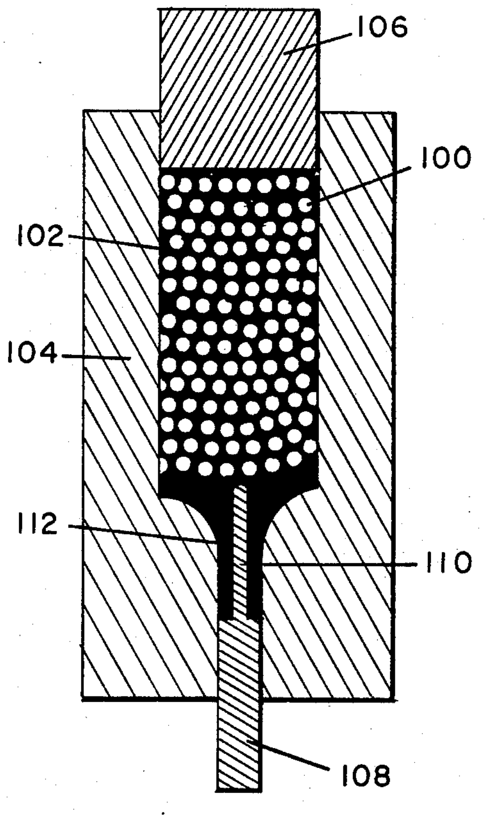

FIG. 3 illustrates a device for producing the open-cellular foam of this invention.

Figure 4:
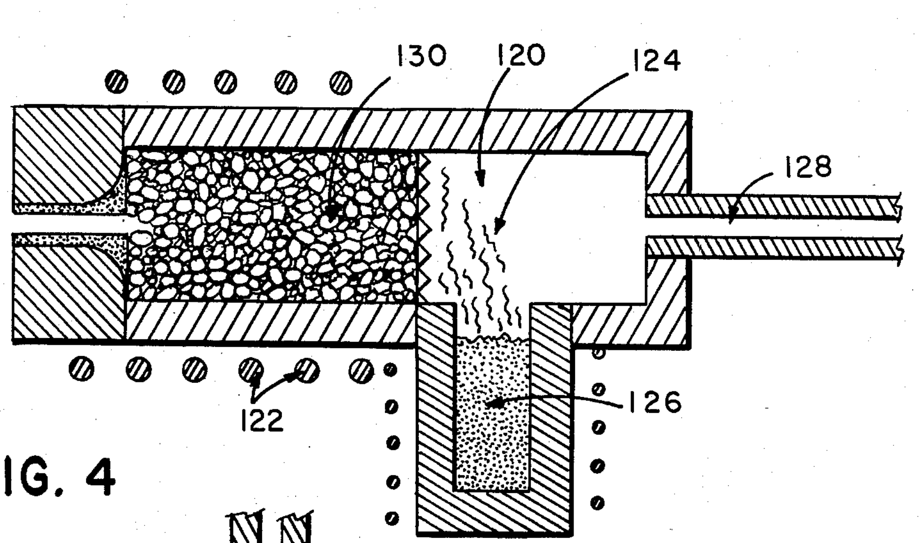

FIG. 4 illustrates a boron diffusion chamber.

Figure 5:
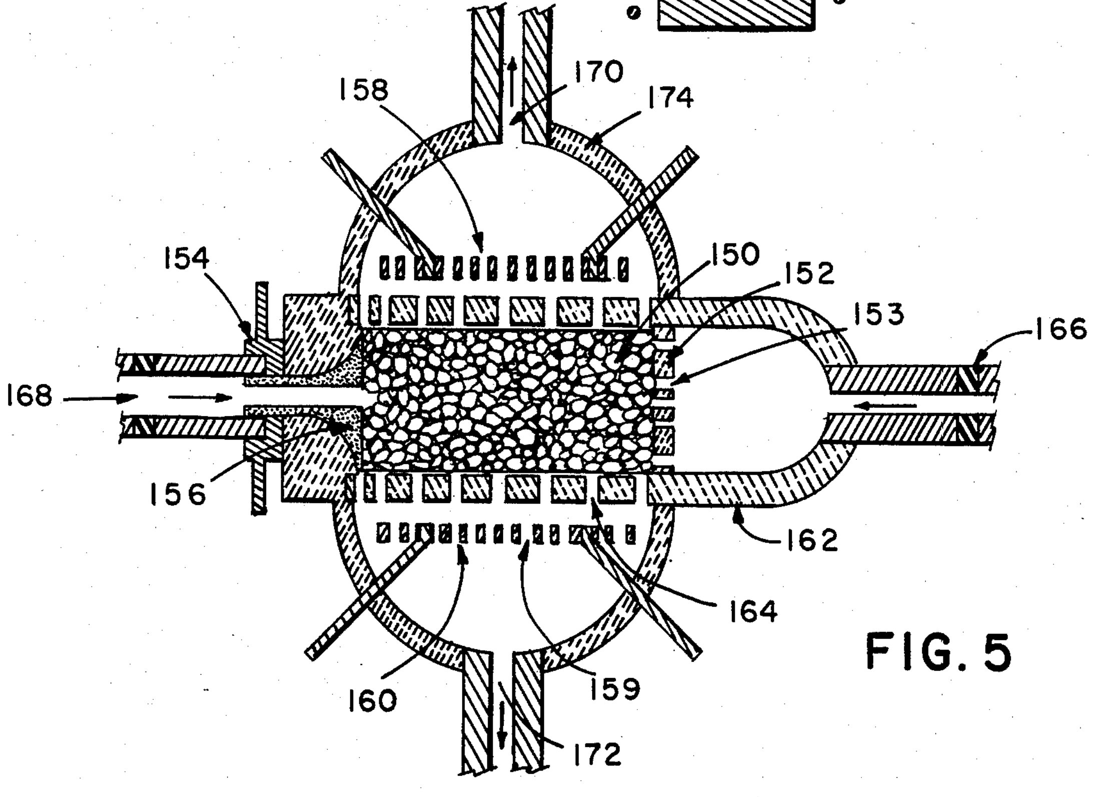

FIG. 5 illustrates an apparatus for fusing silicon particulate to a carbon foamed substrate.

DESCRIPTION OF THE PREFERRED EMBODIMENT(S)

Figure 1:
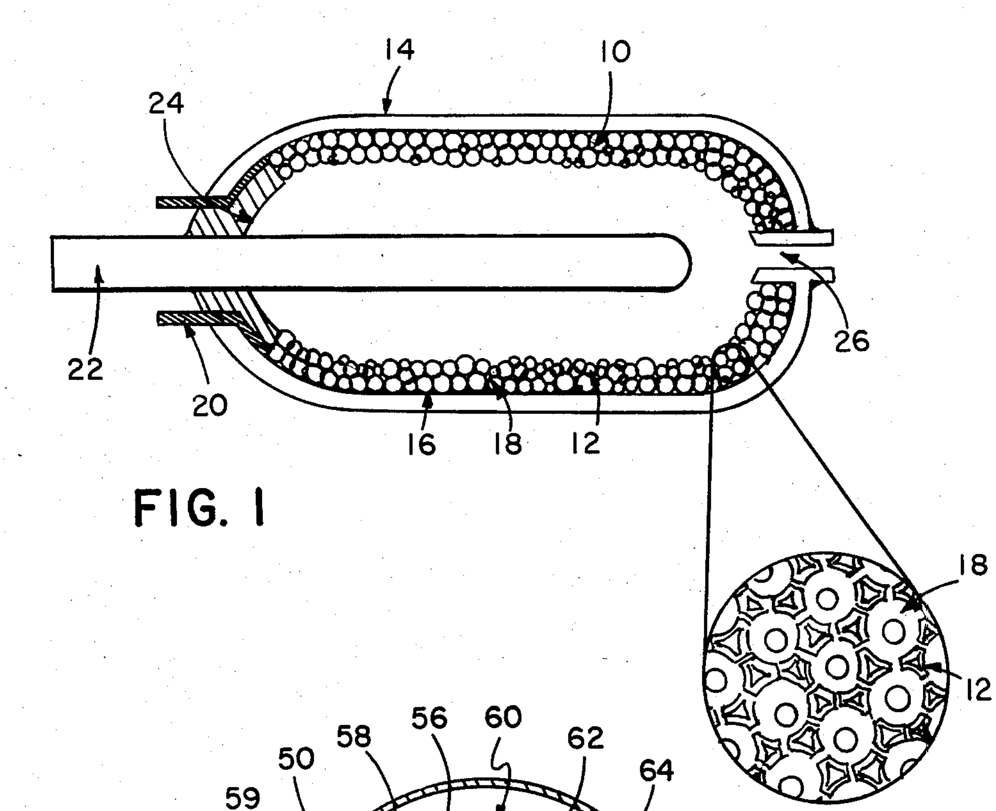
FIG. 1 illustrates a cross-sectional view of a typical nuclear cell of this invention.

FIG. 1 illustrates a cross-sectional view of a typical nuclear cell of this invention. In this embodiment a carbon foam 10 is shown upon which a semiconductive layer 12 such as silicon or equivalent has been coated. Using carbon as the foam substrate has many advantage over other materials as it will not melt and is a good conductor. The carbon foam 10 is held within a combination pressure-housing and radiation shield 14. The core of pressure-housing 14 is filled with carbon foam 10 and around the edges of the carbon foam against the pressure-housing is seen a joining of foam cells forming a surface continuity 16 of solid carbon. Spaces 18 within the foam illustrate the interstices through which the gas can travel. An electrode 20 protrudes from the cell, being interconnected with the surface 16 continuity of the carbon foam, which electrode 20 forms the first pole of the cell. A second electrode 22 forming a di-pole with the first pole extends into the chamber and is surrounded by the semiconductive carbon foam 10. Electrode 22 extends out of the pressure-housing to form a second pole of the energy cell. Insulation 24 is provided between electrode 20, which may form a concentric circle around the second electrode 22, and such second electrode 22 to prevent arcing. The carbon foam in this cell having a semiconductive layer thereon can be activated to produce electric current between the electrodes when an electrically conductive radioactive gas is entered into the cell. Such radioactive gas may be entered into the cell through port 26 from a gas storage means such as a tank or piston or equivalent which are well known in the art. Once the gas has been forced into the cell, the reaction discussed above begins and electrical current will start to be produced.

Figure 2:
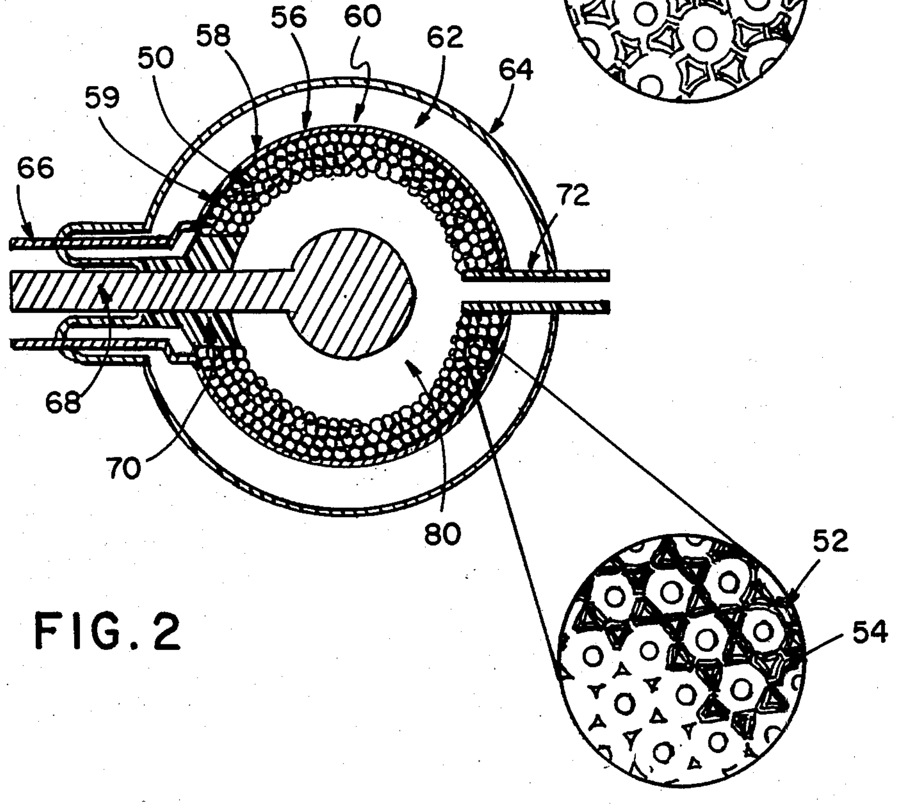
FIG. 2 illustrates a cross-sectional view of an alternate embodiment of a nuclear cell of this invention.
Figure 2A:
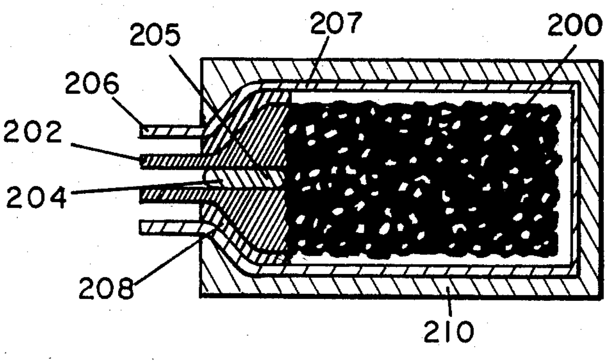

FIG. 2 illustrates another embodiment of this invention incorporating a vacuum chamber wherein the open-cellular carbon foam 50 includes both a semiconductive layer 52 and a phosphor layer 54 thereon. The outer surface of the semiconducting carbon foam 50 forms a nonporous and smooth carbon skin 59 on its outer surface which is coated with metal 58 for surface continuity 56. This resulting central sphere 60 is held within a vacuum chamber 62 which may be formed within a glass housing 64 being the outer wall which further forms the support for the first electrode 66 which extends into the vacuum chamber 62. The carbon foam 50 extends within the central sphere 60 and surrounds a second electrode 68 which forms a di-pole with the first electrode and which extends to the exterior of glass housing 64 to form a second pole. Second electrode 68 is separated by insulation 70 from first electrode 66 and carbon foam 50 to prevent any arcing with the vacuum envelope formed in vacuum chamber 62. Gas is entered into central sphere 60 through inlet 72, also constructed of insulating material, which inlet extends from gas stroage means as described above for use in the first cell example. As before other equivalent methods of introducing gas into the central sphere could be utilized. Around second electrode 68 and carbon foam 50 within central sphere 60 is a space forming chamber 80 to allow for dispersion of the radioactive gas into carbon foam 50 and to help form a uniform conductive path from carbon foam 50 to second electrode 68.

FIG. *2a* illustrates still a further embodiment of a cell produced under this invention having a cellular foam semiconductor core 200, the foam being solidified at one end to form a first terminal 202. Within the solidified end an opening 205 is provided for entry of the activating gas into the cell, which opening is shown sealed by plug 204. Spaced away from and around the cellular core 200 is a conductive surface 207 which terminates outside the cell at second terminal 206 and which surface and terminal are insulated at that end of the cell from the solidified end of the foam core by insulative material 208. The cell can be housed in container 210 and works similarly to the aforementioned cells.

It should be noted that although only three forms of cells are illustrated incorporating a semiconductive carbon foam, other variations of these nuclear cells can be produced within the spirit of this invention utilizing the open-cellular carbon or other foamed semiconductors as disclosed herein.

Since the invention herein concerns foams, it should be noted that in the prior art phenolic and metallic foams are well known and the easiest way to make a carbon foam is by carbonizing a free-rise phenolic foam. Free-rise foams are produced by catalyzing a liquid single-stage resin with an acid. The resin has a blowing agent and as the system heats up due to the reaction between the resin and the acid, the blowing agent vaporizes to form cells while the resin hardens. Another way to manufacture phenolic foams is to put a solid blowing agent into a solid novelac or resol and mold it. In the molding process the injection of the material is "short shotted." The heat of the mold cavity decomposes the blowing agent to produce gas which in turn forms cells. The volume of injected mass increases to fill the cavity while the mold supplies heat to cure the now-formed resin. These methods produce foams with un-uniform cell size and irregular distances between the cells themselves. Moreover, because of the lack of any high pressures during the blowing of the foam, the density of the walls of the cells is low.

The following procedures can be followed for the fabrication of the foamed energy cell of this invention. It is important that, because of the needs of coating the foam with a crystalline semiconductor layer, the foam have a strong integrity and high intercellular wall density. One process shown in FIG. 3 for producing such a foam is to provide a thermal plastic with close to a zero carbon residue, such as a polymethylmethacrylate in the form of beads 100, which is mixed with a predetermined amount of thermosetting resins 102 which may be a phenol or equivalent so that when this mixture is pressurized in mold 104, the powdered resin melts and fuses with itself. A thermal plastic used for the beads can be crystalline and should have as little cold flow as possible at the molding temperature of the thermosetting resin. Plunger 106 creates pressure in mold 104 and after the process is completed, a core pin 108 which was inserted into the resin from below acts as an ejector for the foam from the mold and when removed, forms a channel 110 therein. In the molding process, because the beads have a specific density less than that of the thermosetting resin, they float to the top, leaving a non-porous resin structure 112 around core pin 108 at the bottom of mold 104. If a higher density bead is utilized, such as lead shot, it would sink to the bottom, forming a porous structure at that point. Near the end of the carbonizing stage of the core, oxygen may be passed therethrough which helps to insure the complete openness of the cell structure. An amount of resin is selected so that thermal plastic beads 100 touch in as close-packed a density as the shape of the spheres will allow. The melting point of the thermo-plastic beads should be higher than the mold temperature of the thermo-setting die used to mold the mixture of the thermo-plastic beads and thermo-setting resin. The beads may be of any shape such as spherical, oval, cubic, or pyramidal. The thermo-setting resin can be a phenolic which will produce a glassy carbon or a polyimide to produce a graphite foam or any mixture of these two or any other equivalent high-carbon residue resin. After the mixture has been molded, the molding can be post baked. The molding is then placed in a carbonizing furnace and during the cycle, the low carbon residue thermo-plastic beads 100 vaporize out of the molding, leaving open cells because of bead contact with exactly determined cell size and a high intercellular wall density.

Another method of producing a good quality foam is to use a regular thermoplastic foam and impregnate it with a furfural resin dissolved in a furfural alcohol, squeeze out the excess, and carbonize the resultant matrix.

Although most of this specification concerns the use of carbon foam as a substrate, metallic foams can also be used. One process for the production of metallic foams is to fill a well with carbon foam beads, place a grate over the well with hole sizes less than that of the beads so that they cannot escape and pour a molten metal into the well. After the metal has cooled, the beads are oxidized out to form an open-cellular structure, but the metal is also oxidized. If the oxidation rate of the carbon beads is faster than that of the metal, the foam structure can be preserved although a metal oxide coating will be present which may be cleaned away with an acid.

The next procedure is for a continous film of boron to be laid down internally throughout this open-cellular foam molding structure. One way this procedure can be accomplished is by placing the carbon or other equivalent foam structure in the diffusion chamber depicted in FIG. 4. The chamber is heated, such as by coils 122 therearound and vaporized boron 124 emanating from an adjoining second heated chamber 126 with nitrogen emanating from supply tube 128 is entered into chamber 120. The nitrogen acts as a carrier gas and is passed through the open-cellular carbon foam structure 130 carrying the vaporized boron. Chamber 120 containing open-cellular carbon foam structure 130 is then cooled and the vaporous boron 124 condenses on the carbon foam's cell walls to form a continuous film. The boron film serves two purposes: first it will, during the semiconductor layering step described below, diffuse into the carbon substrate and into the silicon layer to be formed, which diffusion will dope the silicon to produce a semiconductor photocell. The other purpose of the boron film is that its presence at the carbon/silicon junction will prevent the formation of silicon carbide, which is an insulator an detrimental for the purposes of producing a photovoltaic device.

The next step is to produce a polycrystalline silicon layer on top of the boron coated carbon foam. A slurry of micro-divided ultra-pure silicon is formed with a low-boiling liquid. The carbon foam with its boron layer is then immersed into the slurry. Either pressure or vacuum may be applied to the slurry chamber to insure good penetration of the slurry into the carbon foam. When penetrated by the slurry, the foam is removed therefrom and placed into a heated vacuum chamber to remove the liquid part of the slurry. As the liquid is removed, the silicon particulate concentrates and dries on the cell walls. The next step is to melt and fuse the silicon particulate to produce a continuous polycrystalline semiconductive layer. This process must be accomplished as quickly as possible to avoid production of silicon carbide or at least to hold the production of silicon carbide to an absolute minimum. One method of accomplishing this fusion is to use the carbon foam substrate as a pole for the di-electric heating thereof. When the potential of the proper voltage and frequency is applied, then the carbon substrate, being a pole, will heat, causing the silicon particles to melt and fuse. The cooling of the layer is critical as it determines the morphology of the polycrystalline layer. When the silicon particles have fused and form a continuous molten film layer throughout the open carbon cellular structure, at the moment the di-electric current is turned off, a cold gas formed from liquid nitrogen can be passed through the carbon foam to freeze the innate crystal structure. This may be followed immediately by the introduction of a hot gas to prevent the damage of the carbon foam that would result from thermal shock due to the sudden lowering of temperature, but such hot gas should not be hot enough to remelt the silicon film layer.

An apparatus for fusing the silicon particulate to the carbon foamed substrate to form a semiconductive layer is shown in FIG. 5. Seen in this view is the foamed boron-treated carbon foam 150 that has silicon particulate coating all of its internal surfaces. At the end thereof is a ceramic diffusion plate 152 with holes 153 therein to allow gas flow therethrough. An electrode 154 is connected to the carbon substrate by means of the carbon structure 156 originally formed as resin around the core pin which has been removed therefrom. The second electrode has its elements 158 and 160 disposed above and below the carbon foam having diffusion holes 159 formed therein for gas passage therethrough. Carbon foam 150 is contained within a ceramic subvessel 162 which has therein a plurality of combination gas-flow control and diffusion holes 164. First inlet tube 168 allows gas to enter the carbon foam from the side having the first electrode through carbon structure 156. Second inlet tube 166 allows gas to enter from the opposite side of the carbon foam through holes 153 in ceramic diffusion plate 152. The gas, after passing through the first and second inlet tubes, goes through the carbon foam and exits through the first and second outlet ports 170 and 172 at the top and bottom of the ceramic electrode housing 174 which contains the ceramic subvessel 162 and the second electrodes. Valves can be provided on the inlets and ports to control the flow of gas and the internal pressure in the ceramic electrode housing 174. While one gas can be entered from the first inlet, a second kind of gas can be provided from the opposite second inlet. When current is applied through the first and second electrodes, the resulting heat in the carbon foam melts the silicon particulate and immediately upon cessation of the current, cold gas formed from liquid nitrogen or equivalent cold gas is passed through one of the inlets through the carbon foam causes the silicon to uniformly crystallize. A second hot gas as discussed above can be then entered for example through the second inlet.

Another method of forming the semiconductor layer is by the decomposition of a silane by ionizing noble gas in the structure as described above. In some cells, it may be desirable to prevent damage to the semiconductor layer due to radiation. One way to accomplish this is in a suitable chamber, a set of ceramic rolls, heated internaly by a gas and oxygen, is used to melt and shear together a mixture of glass, phosphor and a radioactive source, all with close melting points. The chamber can also be pressurized to supress the boiling points of any of the components. An example of three components which would meet the requirements are silicon dioxide, calcium and zinc sulfide. The resulting rolled admixture is ground to a size where a slurry of a low boiling liquid and this admixture can penetrate the foam semiconductor. Because the radioactive source and phosphor are held internally in a glass matrix, only light escapes and the possible damaging emissions from the radioactive source do not reach the semiconductor layer.

The foamed cell of this invention, as stated before, has a great surface area. For example, a cylinder of such foam having a 1 inch diameter and a height of 2 inches with cell diameters of 1/64 inch has been calculated to have approximately 8 sq. ft. of internal surface area.

Although the present invention has been described with reference to particular embodiments, it will be apparent to those skilled in the art that variations and modifications can be substituted therefore without departing from the principles and spirit of the invention.

I claim:

1. An electric current generating cell comprising:

an open-cellular foamed semiconductor;

a vessel containing such open-cellular foamed semiconductor;

a continuous electroconductive layer formed around the outer sides of said open-cellular foamed semiconductor;

means to excite said semiconductor to produce electric current;

electrode means to carry said electric current outside said open-cellular foam semiconductor, said electrode means being further adapted to form said cells output terminals, said electrodes means including:

a first electrode entered into said vessel and surrounded by said open-cellular foam semiconductor;

a second electrode contiguous with said continuous electroconductive layer around said open-cellular foamed semiconductor; and said means to excite said semiconductor including: means to enter gas into said cell; and a gas entered into said cell through said means to enter gas to cause the production of electricity from said cell.

2. The electric current generating cell of claim 1 wherein said gas is a radioactive gas and said continuous polycrystalline semiconductive layer contains a luminescent material that emits rays when excited by said radioactive gas, said rays causing said cell to produce electric current.

3. The electric current generating cell of claim 1 wherein said gas is a radioactive gas which gas further contains an ionizable gas that emits ray when excited by said radioactive portion of said gas, said rays causing said cell to produce electric current.

4. The electric current generating cell of claim 1 further including:

a metallized electroconductive layer coated around said opencellular foam semiconductor; and a vacuum chamber formed around said metal coated opencellular foam semiconductor;

said first electrode extending from within the metal coated open-cellular foam semiconductor; and said second electrode positioned in the vacuum chamber formed around the metal coated open-cellular foam semiconductor, said second electrode contacting said metallized electroconductive layer.

* * * * *